(12) United States Patent
Lilly et al.

(10) Patent No.: US 10,459,429 B2
(45) Date of Patent: Oct. 29, 2019

(54) HIGHLY AUTOMATED APPLICATION OF DIGITAL FINISH MATERIAL TO 3D DATA

(71) Applicant: Dassault Systemes 3Dexcite Corp., Royal Oak, MI (US)

(72) Inventors: Alan Lilly, Holly, MI (US); Thomas Celusnak, Shelby Township, MI (US)

(73) Assignee: DASSAULT SYSTEMES 3DEXCITE CORP., Royal Oak, MI (US)

( * ) Notice: Subject to any disclaimer, the term of this patent is extended or adjusted under 35 U.S.C. 154(b) by 220 days.

(21) Appl. No.: 15/389,720

(22) Filed: Dec. 23, 2016

(65) Prior Publication Data
US 2018/0181109 A1    Jun. 28, 2018

(51) Int. Cl.
*G05B 19/4097* (2006.01)
*G06F 17/50* (2006.01)

(52) U.S. Cl.
CPC ......... *G05B 19/4097* (2013.01); *G06F 17/50* (2013.01); *G05B 2219/35012* (2013.01); *G06F 17/5095* (2013.01)

(58) Field of Classification Search
CPC ............................ G05B 19/4097; G06F 17/50
USPC ......................................................... 700/98
See application file for complete search history.

(56) References Cited

U.S. PATENT DOCUMENTS

| 6,888,542 | B1 * | 5/2005 | Clauss | G06F 17/50 |
| | | | | 345/420 |
| 2002/0130869 | A1 * | 9/2002 | Camiener | G06F 17/50 |
| | | | | 345/440 |
| 2004/0128016 | A1 | 7/2004 | Stewart | |
| 2005/0065952 | A1 * | 3/2005 | Dettinger | G06F 16/258 |
| 2013/0268416 | A1 * | 10/2013 | Sandow | G06Q 10/0833 |
| | | | | 705/28 |
| 2015/0039490 | A1 | 2/2015 | Forrester et al. | |
| 2015/0213154 | A1 | 7/2015 | Toebben et al. | |

FOREIGN PATENT DOCUMENTS

WO    WO-2017093027 A1 *    6/2017    ............. G06F 17/50

OTHER PUBLICATIONS

Microsoft Corp., Excel 97-2007 Binary File Format(xls) Specification, 2007; p. 123. (Year: 2007).*
European Search Report, EP 17206855.3, entitled, "Highly Automated Application of Digital Finish Material to 3D Data," dated Apr. 23, 2018.

* cited by examiner

*Primary Examiner* — Mohammad Ali
*Assistant Examiner* — Joshua T Sanders
(74) *Attorney, Agent, or Firm* — Hamilton, Brook, Smith & Reynolds, P.C.

(57) ABSTRACT

Methods and systems display a computer-aided design (CAD) model with finish material specificity. An example embodiment begins by defining a CAD model in memory where the CAD model represents a real world physical object and the CAD model comprises a plurality of parts. Next, the example embodiment obtains spreadsheet data that relates material finishes with item numbers, and then, reformats the obtained spreadsheet data into a structured database. In turn, indications associating the parts or model elements of the CAD model with the item numbers are received and the CAD model is automatically displayed with the parts having the material finishes based on the structured database and the received indications of item numbers associated with the parts of the CAD model.

20 Claims, 8 Drawing Sheets
(4 of 8 Drawing Sheet(s) Filed in Color)

EXAMPLE.xlsx - Excel — 241

| | A | B | C | D | E |
|---|---|---|---|---|---|
| 1 | ITEM NUMBER | DESCRIPTION | PLAIN PEN MATERIAL CODE | WOOD PEN MATERIAL CODE | PREMIUM PEN MATERIAL CODE |
| 2 | 1 | TIP | MAT01 | MAT01 | MAT01 |
| 3 | 2 | NIB | MAT02 | MAT02 | MAT06 |
| 4 | 3 | GRIP | MAT03 | MAT08 | MAT07 |
| 5 | 4 | BODY | MAT07 | MAT05 | MAT06 |
| 6 | 5 | END | MAT03 | MAT07 | MAT01 |
| 7 | 6 | CAP | MAT07 | MAT05 | MAT06X |
| 8 | 7 | CLIP | MAT02 | MAT02 | |
| 9 | 8 | TOP | MAT03 | MAT07 | MAT01 |
| 10 | | | | | |
| 11 | Legend | | | | |
| 12 | INVALID MATERIAL CODE | | | | |
| 13 | MISSING MATERIAL CODE | | | | |

242 points to MAT06X (cell E7); 243 points to the empty cell E8.

HIGHLY AUTOMATED APPLICATION OF DIGITAL FINISH MATERIAL TO 3D DATA

BACKGROUND

Embodiments of the invention generally relate to the field of computer programs and systems, and specifically to the field of computer aided design (CAD), computer-aided engineering (CAE), modeling, marketing, computer-generated imagery (CGI), and simulation.

A number of systems and programs are offered on the market for the design of parts or assemblies of parts. These so called CAD systems allow a user to construct and manipulate complex three-dimensional models of objects or assemblies of objects. CAD systems thus provide a representation of modeled objects using edges or lines, in certain cases with faces. Lines, edges, faces, or polygons may be represented in various manners, e.g., non-uniform rational basis-splines.

These CAD systems manage parts or assemblies of parts of modeled objects, which are mainly specifications of geometry. In particular, CAD files contain specifications, from which geometry is generated. From geometry, a representation is generated. Specifications, geometries, and representations may be stored in a single CAD file or multiple CAD files. CAD systems include graphic tools for representing the modeled objects to the designers; these tools are dedicated to the display of complex objects. For example, an assembly may contain thousands of parts. A CAD system can be used to manage models of objects, which are stored in electronic files.

SUMMARY OF THE INVENTION

While methods and CAD systems exist for representing and displaying CAD models and representations of CAD models, referred to hereinafter generally as CAD models, these systems and methods require resources to display the CAD models, particularly when the CAD models are displayed with their finish material. Thus, such systems and methods can benefit from efficiency improvements. Embodiments of the present invention provide improved methods and systems for displaying CAD models.

One such example embodiment provides a method of displaying a CAD model that begins by defining, in memory, a three-dimensional (3D) CAD model representing a real-world physical object, where the CAD model comprises a plurality of parts. The example method continues, via one or more processors, by obtaining spreadsheet data (i.e., data from a spreadsheet) that relates material finishes with item numbers and then, reformatting the obtained spreadsheet data into a structured database. In turn, this example method embodiment receives indications associating the parts of the CAD model with the item numbers and automatically displays the CAD model with the parts having the material finishes based on the structured database and the received indications of item numbers associated with the parts of the CAD model. Herein, the terms render, display, and output are used interchangeably.

According to an example embodiment of the method, automatically displaying the CAD model comprises: (1) identifying a given item number associated with a given part of the CAD model, (2) in the database, determining a respective material finish related to the identified item number, and (3) displaying the given part of the CAD model with the determined material finish. Another embodiment of the method further includes automatically integrating material information from a third party source into the structured database. In one such embodiment of the present invention, the obtained spreadsheet data relates material finish to item numbers based upon a style package associated with the item numbers. Further still, in yet another example method embodiment, the spreadsheet data contains conditional logic that relates the material finishes with the item numbers.

An alternative embodiment of the method further comprises identifying an error in the structured database relating material finishes with item numbers. Moreover, such an example embodiment may further comprise highlighting, in the displayed CAD model, a given part associated with the identified error. Further still, an example embodiment that identifies an error in the structured database may further include prompting the user to correct the identified error.

Another embodiment of the present invention is directed to a system for displaying a CAD model. The system, according to an embodiment, comprises a processor and a memory with computer code instructions stored thereon, where the processor and the memory, with the computer code instructions, are configured to cause the system to define, in the memory, a 3D CAD model representing a real-world physical object, where the CAD model comprises a plurality of parts and further, obtain spreadsheet data that relates material finishes with item numbers. In such a system embodiment, the processor and the memory, with the computer code instructions, are further configured to cause the system to reformat the obtained spreadsheet data into a structured database, receive indications associating the parts of the CAD model with the item numbers and, in turn, automatically display the CAD model with the parts having the material finishes based on the structured database and the received indications of item numbers associated with the parts of the CAD model.

In an alternative system embodiment, in automatically displaying the CAD model, the processor and the memory, with the computer code instructions, are further configured to cause the system to identify a given item number associated with a given part of the CAD model, determine, in the database, a respective material finish related to the identified item number, and display the given part of the CAD model with the determined material finish. According to another embodiment of the system, the processor and the memory, with the computer code instructions, are further configured to cause the system to automatically integrate information from a third party source into the structured database.

In yet another embodiment of the system, the obtained spreadsheet data relates material finish to item numbers based upon a style package associated with the item numbers. Further still, in another embodiment, the spreadsheet data contains conditional logic that relates the material finishes with the item numbers.

An alternative embodiment of the system is configured, via the processor and the memory, with the computer code instructions, to identify an error in the structured database relating material finishes with item numbers. Such a system embodiment may be further configured to highlight a part associated with the identified error in the displayed CAD model. Further still, an embodiment of the system is further configured to prompt the user to correct the identified error.

Yet another embodiment of the present invention is directed to a cloud computing implementation for displaying a CAD model. Such an embodiment is directed to a computer program product executed by a server, in communication across a network, with one or more clients. In such an embodiment, the computer program product comprises a computer readable medium which comprises program instructions, which, when executed by a processor, causes the processor to define, in memory, a 3D CAD model representing a real-world physical object, where the CAD model comprises a plurality of parts. Further still, in such a cloud computing environment, the program instructions, when executed, further cause the processor to obtain spreadsheet data relating material finishes with item numbers, reformat the obtained spreadsheet data into a structured database, receive indications associating the parts of the CAD model with the item numbers, and automatically display the CAD model with the parts having the material finishes based on the structured database and the received indications of item numbers associated with the parts of the CAD model.

In another embodiment of the computer program product, in automatically displaying the CAD model, the program instructions, when executed, cause the processor to identify a given item number associated with a given part of the CAD model, determine, in the database, a respective material finish related to the identified item number, and display the given part of the CAD model with the determined material finish. Further, in an alternative embodiment of the computer program product, the obtained spreadsheet data relates material finish to item numbers based upon a style package associated with the item numbers. Further still, in yet another embodiment, the spreadsheet data contains conditional logic that relates the material finishes with the item numbers.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Embodiments of the present invention provide methods and systems for displaying a CAD model. Specifically, embodiments provide solutions for displaying a CAD model with the proper finish materials. Such functionality can be used for displaying computer generated images and animations for product design, engineering visualization, video games, advertising, marketing, and business intelligence.

Many organizations use 3D CAD data for the creation of complex consumer-facing products, such as automobiles for limiting examples. The 3D CAD data typically describes the physical parameters of the part, but does not include information about the part related to its final appearance material, i.e., finish material. For example, a part may be made from steel (its construction material), but is ultimately painted black (its finish material). The CAD data is typically managed by engineers that create and validate the parts, but typically do not manage the finish material of a part.

Meanwhile, information related to the final appearance, i.e., finish material, is typically managed by employees with a design background related to color appearance, fashion, color trends, tradedress (branding) etc. The information about finish materials is typically managed outside of traditional PLM/CAD systems, using spreadsheets and image based formats. Spreadsheets and image based formats are typically error-prone, as values, descriptions, etc. are manually entered and not procedurally checked for errors. Thus, under the existing paradigm, there is no direct mapping of the finish material data to the CAD model data, i.e., parts of the CAD model.

In order to accurately visualize the appearance of a CAD part, i.e., the collection of CAD parts that create a product represented by the CAD model, the two data sources (CAD data and spreadsheets) need to be combined. In other words, there must be a mapping between the spreadsheet finish material data and the CAD model data. Using existing procedures, this is a 100% manual process that is very time consuming and error prone due to the complexity of information to manage for both CAD model parts (1000s of parts) and finish material (many parts are created each with multiple different finish materials). In addition, conditional logic is needed to accurately represent the finish material of parts based on other variables (e.g., Part A is "Black Paint" under one condition, but Part A is "Red Paint" under another condition).

As noted, while methods exist for connecting finish material to individual CAD parts, these existing methods are entirely manual and thus, extremely time consuming. For instance, an example automotive CAD model may include 5000 parts, each of which has a specific finish material. Thus, managing the finish material that should be displayed for each of those 5000 parts is time-intensive and error-prone. An example existing workflow is a multi-step process that requires (1) creating a CAD model, (2) obtaining spreadsheet and image sheet data, (3) using the image sheets, manually identifying the image numbers associated with given CAD geometries, (4) determining a style package to color the CAD model, and (5) coloring each geometry according to the material information corresponding to the associated item numbers in the obtained spreadsheet data for the selected style package. Moreover, this process must be repeated for each geometry, for each style package, associated with the model.

Figure 1:
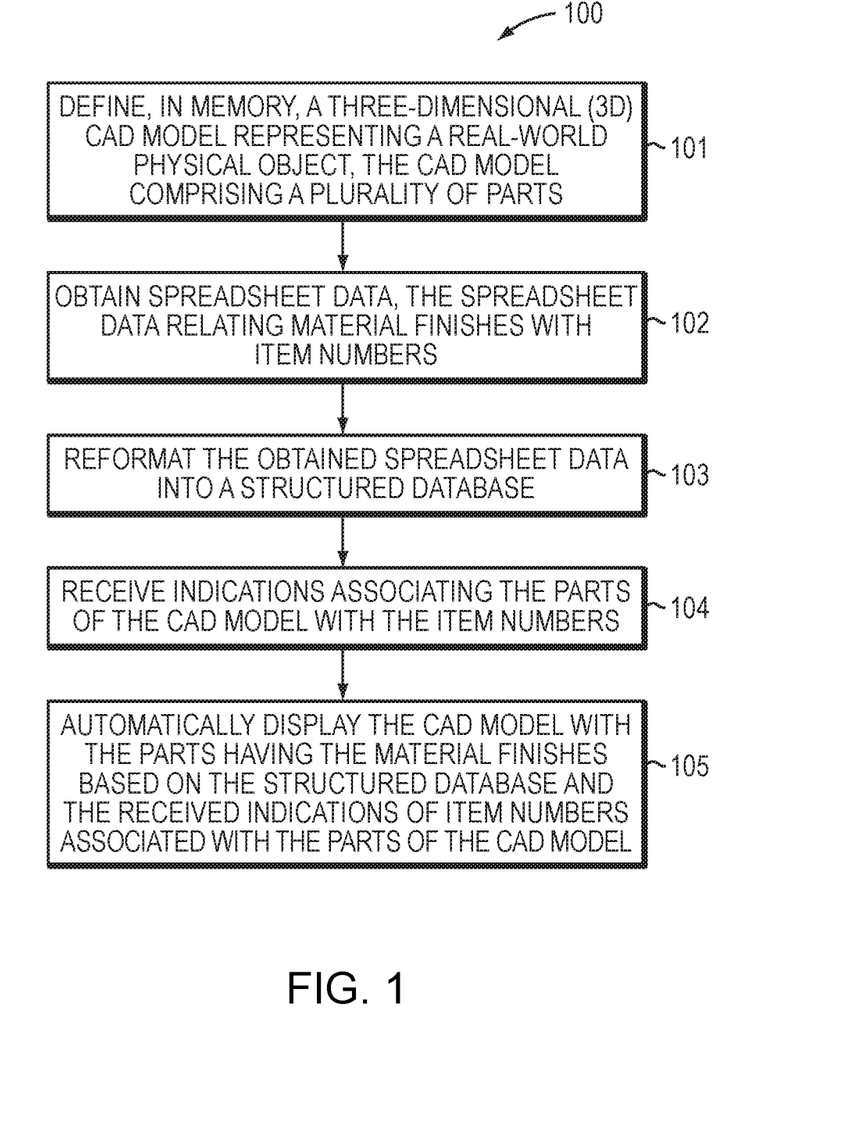
FIG. 1 is a flowchart of a method of displaying a CAD model according to an embodiment.

Embodiments of the present invention solve the aforementioned problems and provide automated methods and systems for mapping finish material data to CAD model data so as to automatically display the CAD model with the proper finish material. FIG. 1 illustrates a flowchart of an example method 100 for displaying a CAD model according to the principles of an embodiment of the present invention. The method 100 begins at step 101 by defining a three-dimensional CAD model representing a real-world physical object, where the CAD model comprises a plurality of parts.

According to an embodiment, the CAD model may be defined according to any principles known in the art. Likewise, while described as a CAD model, the model defined at step 101 may be any computer based model known in the art.

Further, while a CAD model typically includes the underlying geometry of the various components of the CAD model, the model defined at step 101 may instead only be a representation of the CAD model, and thus, may not include the underlying geometry. Further, while the CAD model is described as representing a real-world physical object, embodiments of the invention are not so limited. Instead, in an embodiment, the model defined at step 101 may represent any object whether real or contemplated (hypothesized) that is going to be displayed.

To continue, the method 100, at step 102 obtains spreadsheet data that relates material finishes with item numbers. In a computer implemented embodiment of the method 100, the data may be obtained at step 102 from any computing device, e.g., computer, storage device, memory, or combination of computing devices communicatively coupled or capable of being communicatively coupled to the computing device performing the method 100. According to an embodiment, the spreadsheet data may be any spreadsheet data known in art, e.g. Excel (Trademarked by Microsoft Corporation), color and style data, etc. Further, according to an embodiment, the data obtained at step 102 may be any data, i.e., in any format, that relates material finishes with item numbers. A simplified example of such data is shown in Table 1 below.

TABLE 1

Spreadsheet Data

| Item Number | Material Finish (style 1) | Material Finish (style 2) |
|---|---|---|
| 1 | red paint | blue paint |
| 2 | black paint | white paint |

A further example of spreadsheet data is described herein below in relation to FIG. 2B. According to an embodiment, the spreadsheet data obtained at step 102 relates material finish to item numbers based upon a style package associated with the item numbers. For instance, in such an embodiment, the obtained data may indicate that item number 1 is wood for the premium style package and item number 1 is black paint for the standard style package. Thus, the data obtained at step 102 may indicate that a given item number is associated with multiple material finishes depending on various conditions, e.g., style package. Likewise, according to an embodiment, the spreadsheet data obtained at step 102 may contain conditional logic that relates the material finishes with item numbers. For instance, the data in such an embodiment may indicate that item 2 has a red paint material finish if item 1 has a black paint material finish and item 2 has a wood material finish if item 1 has a wood material finish. The spreadsheet data obtained at step 102 may also include image sheets that depict parts of the CAD model or representations thereof, with associated item numbers.

Next, the method 100, at step 103, reformats the obtained spreadsheet data into a structured database. This reformatting may be the result of a process/logic determined by a user. An example of a process 350 that may be implemented at step 103 is described herein below in relation to FIG. 3. Further, an example illustrating the structure of the reformatted data is described herein in relation to FIG. 2B. According to an embodiment, at step 103, the unstructured spreadsheet data is formatted into a relational database that properly and clearly structures the various data elements from the data obtained at step 102. Such reformatting may include removing conditional logic and instead, structuring the data to indicate the material finish for each different logical scenario. Removing the logical conditioning and replacing it with the solved logical results in the database can provide a method that facilitates more quickly displaying the CAD model by eliminating the need to solve the logical conditions each time the model is displayed.

An alternative embodiment of the method 100 further includes automatically integrating material information from a third party source into the structured database formed at step 103. Example third party sources include the databases and websites for third parties offering coloring and material services, e.g., Thierry. For instance, such functionality may access a third party database or website to obtain the exact color specifications associated with a material indicated in the data reformatted into the structured database at step 103.

In turn, the method 100 continues by receiving indications associating the parts of the CAD model with item numbers. In other words, data is received at step 104 that provides the appropriate item number for specific parts of the CAD model. To illustrate a simplified example where the CAD model is a car, the indications received at step 104 may indicate that the car body is item number 1 and the car grille is item number 2. These indications may be received via any means known in the art and likewise, the indications may be received via any device known in the art that is communicatively coupled or capable of being communicatively coupled to a computing device implementing the method 100. For instance, the indications may be received via a CAD software package used by a user to display a CAD model. According to an embodiment, the indications received at step 104 include tags associated with the parts of the CAD model where the tags indicate the item numbers.

Upon receipt of the indications at step 104, the method 100, at step 105, automatically displays the CAD model with the parts having the material finishes based on the structured database and the received indications of item numbers associated with the parts of the CAD model. According to an embodiment, displaying the CAD model at step 105 includes: (1) identifying an item number associated with a given part of the of CAD model (using the data received at step 104), (2) determining, using the data reformatted into the database at step 102, a respective material finish related to the identified item number, and (3), displaying the given part of the CAD model with the determined material finish.

To illustrate, consider the aforementioned vehicle example where the obtained spreadsheet data is reformatted at step 103 and style 1 is being displayed. Here, the reformatted data indicates that item number 1 has a red paint material finish and item number 2 has a black paint material finish. In such an example, the indications received at step 104 indicate that the body of the car is associated with item number 1 and the grille of the car is associated with item number 2. To display the CAD model of the car, the database is used to identify that item number 1 has a red paint material finish and the received indications are used to determine that the car body is associated with the item number 1 and, in turn, the body of the car is automatically displayed with a red paint material finish. Similarly, the database is used to identify that item number 2 has a black paint material finish and the received indications are used to determine that the car grille is associated with the item number 2 and, thus, the car grille is automatically displayed with a black paint material finish. Such an automated finish display methodology can be repeated for any number of parts of the CAD model for which data is available.

In an alternative embodiment, prior to the displaying at step 105, the method 100 receives an indication of a selected style of the CAD model to display. In turn, the method 100, at step 105, traverses the geometry of the CAD model and uses the reformatted data to determine the applicable material, in light of the selected style for each piece of geometry and then, the CAD model is rendered with the determined digitized materials.

An alternative embodiment of the method 100 further includes error checking functionality. Such an embodiment may include identifying an error in the structured database relating material finishes with item numbers. Example identified errors may include typographical errors, item numbers that are missing associated material information, improper material information (e.g., a description of the material rather than a proper material code), and/or item numbers that for instance, have associated material information that is incompatible with an associated style package. In an example embodiment where errors are identified, the displayed effected CAD model part may be highlighted to indicate the error. For example, if material information is missing for the side-view mirror of the CAD model of the car, then the embodiment system displays the side-view mirror highlighted to indicate the omission. Such an embodiment may go even further and proactively prompt the user, via a user interface, to correct the identified error. An example prompt may state "There is no material information associated with the side-view mirror for the premium package, please provide such information."

Figure 2A:
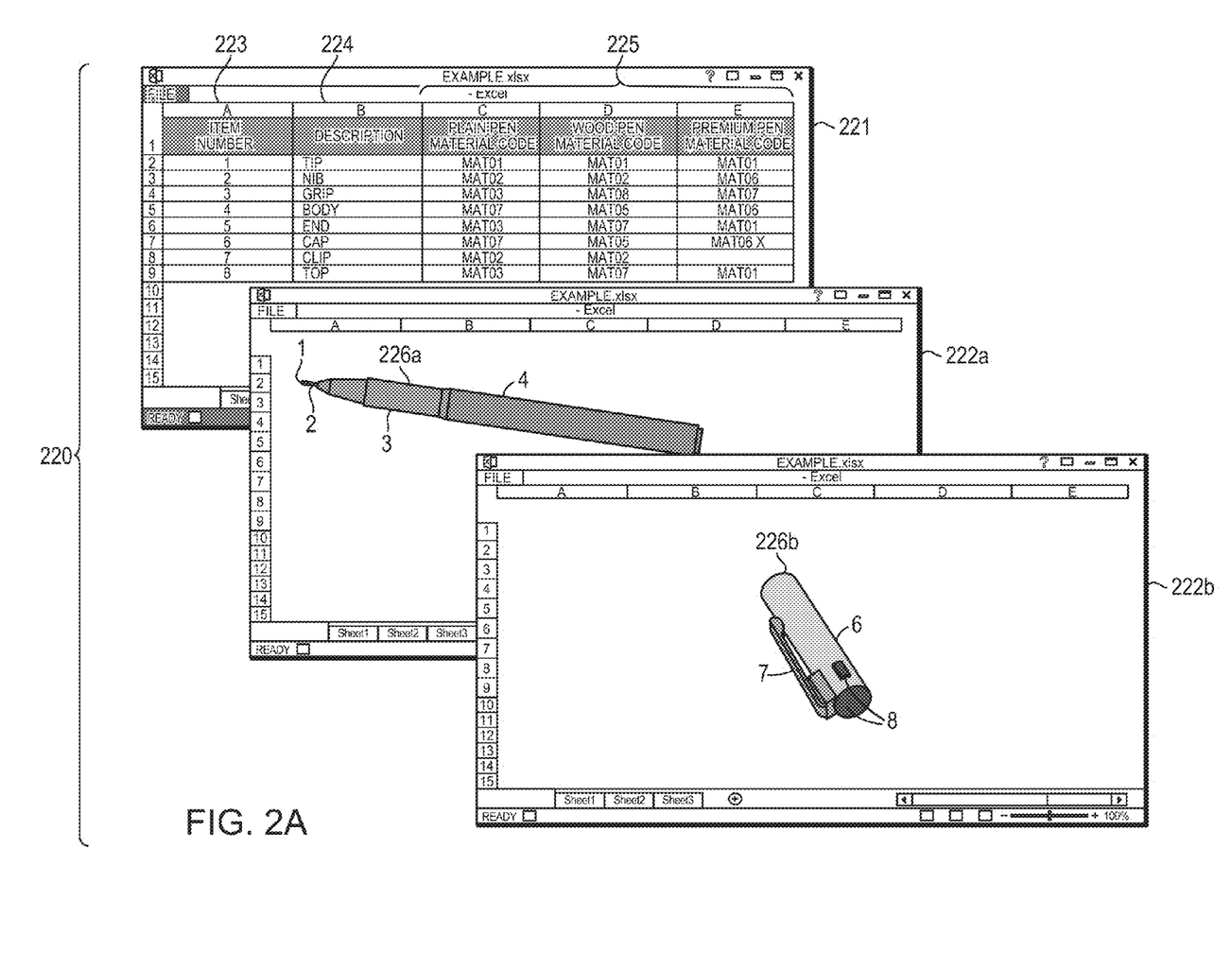
FIGS. 2A-D illustrate stages of a method of displaying a CAD model according to an example embodiment of the present invention.

FIGS. 2A-2D illustrate steps of a process for displaying a CAD model according to an embodiment of the present invention. FIG. 2A illustrates unstructured data 220 that is first received. The unstructured, e.g. spreadsheet data 220 includes the material data sheet 221 and the image data sheets 222a and 222b. The material data 221 includes the item numbers 223, a description of the item numbers 224 and the material information 225 associated with the item numbers. The material information 225 associated with the item numbers 223 indicates that different materials are associated with a given item number based upon the style package, e.g., plain pen, wood pen, and premium pen. The unstructured data 220 further includes the style sheets 222a and 222b. The style sheets 222a-b indicate the item numbers 1-8 associated with a rendering of the parts 226a-226b of the pen (which may be a CAD model). In an embodiment, the style sheets 222a-b can be used to provide indications associating parts of a CAD model of the pen with the item numbers 223.

Figure 2B:
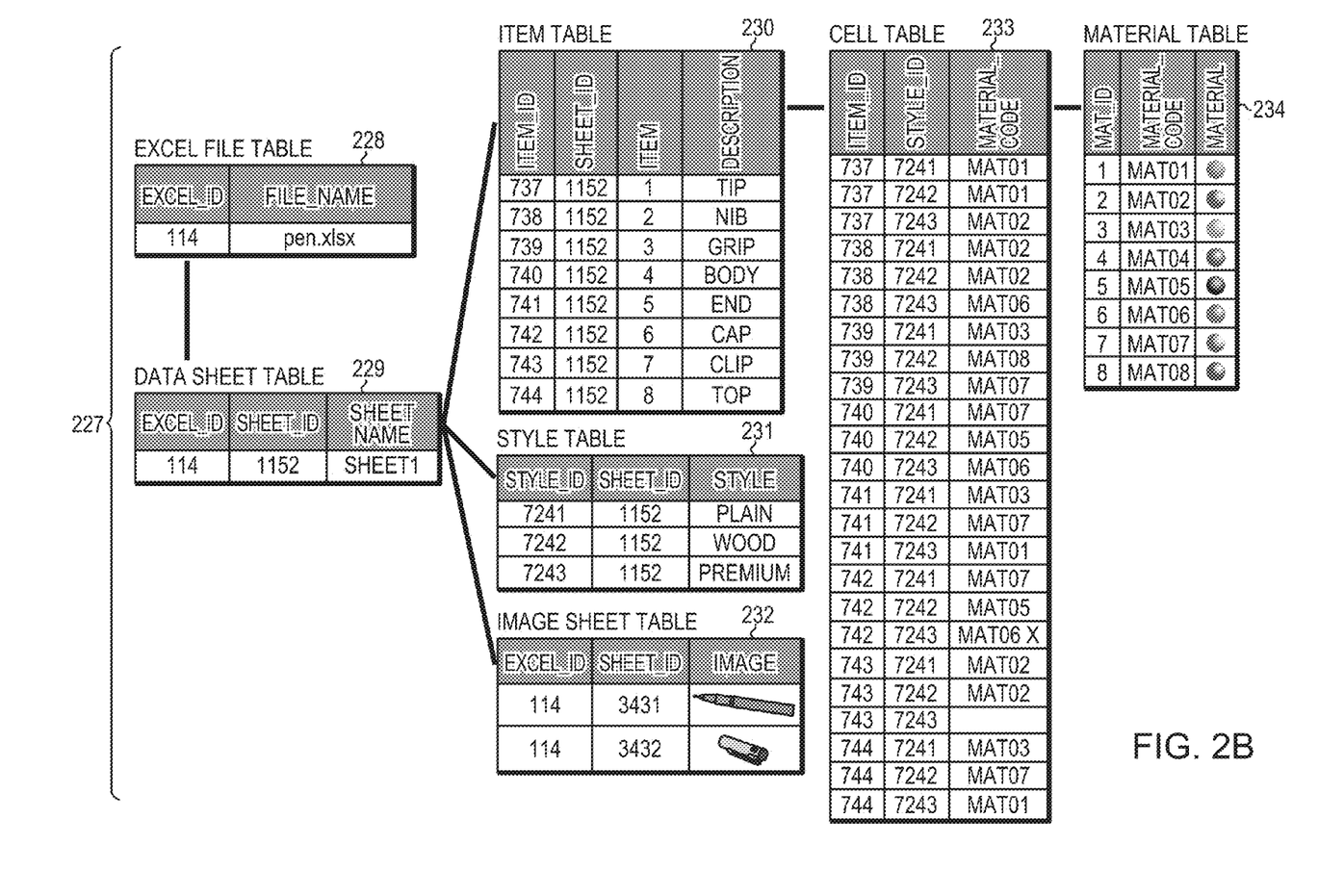

The process depicted in FIGS. 2A-2D continues by reformatting the unstructured data 220 of FIG. 2A into a structured database depicted in FIG. 2B. To reformat the unstructured data 220 into the structured database 227 of FIG. 2B the filename of the unstructured data 220 is put into the Excel file table 228 and the data sheet table 229 is likewise populated with the filename or other indications of the material datasheet 221. Similarly, the image sheet data from the sheets 222a-b are formatted into the image sheet table 232. To continue, the item number data 223 and description data 224 are formatted into the item table 230 and the column headers "Plain Pen Material Code," "Wood Pen Material Code," and "Premium Pen Material Code" from the material data 225 are reformatted into the style table 231. Further, individual cell information from the material data 225 is formatted into the cell table 233 and the material codes that are part of the cell information 225 are loaded into the material table 234. The reformatting used in FIG. 2B may be the result of any conditional programming that is desired and needed in light of the received unstructured data 220 and thus, the reformatting illustrated in FIG. 2B may be customized as needed. An example of a reformatting process is described herein below in relation to FIG. 3.

Figure 2C:
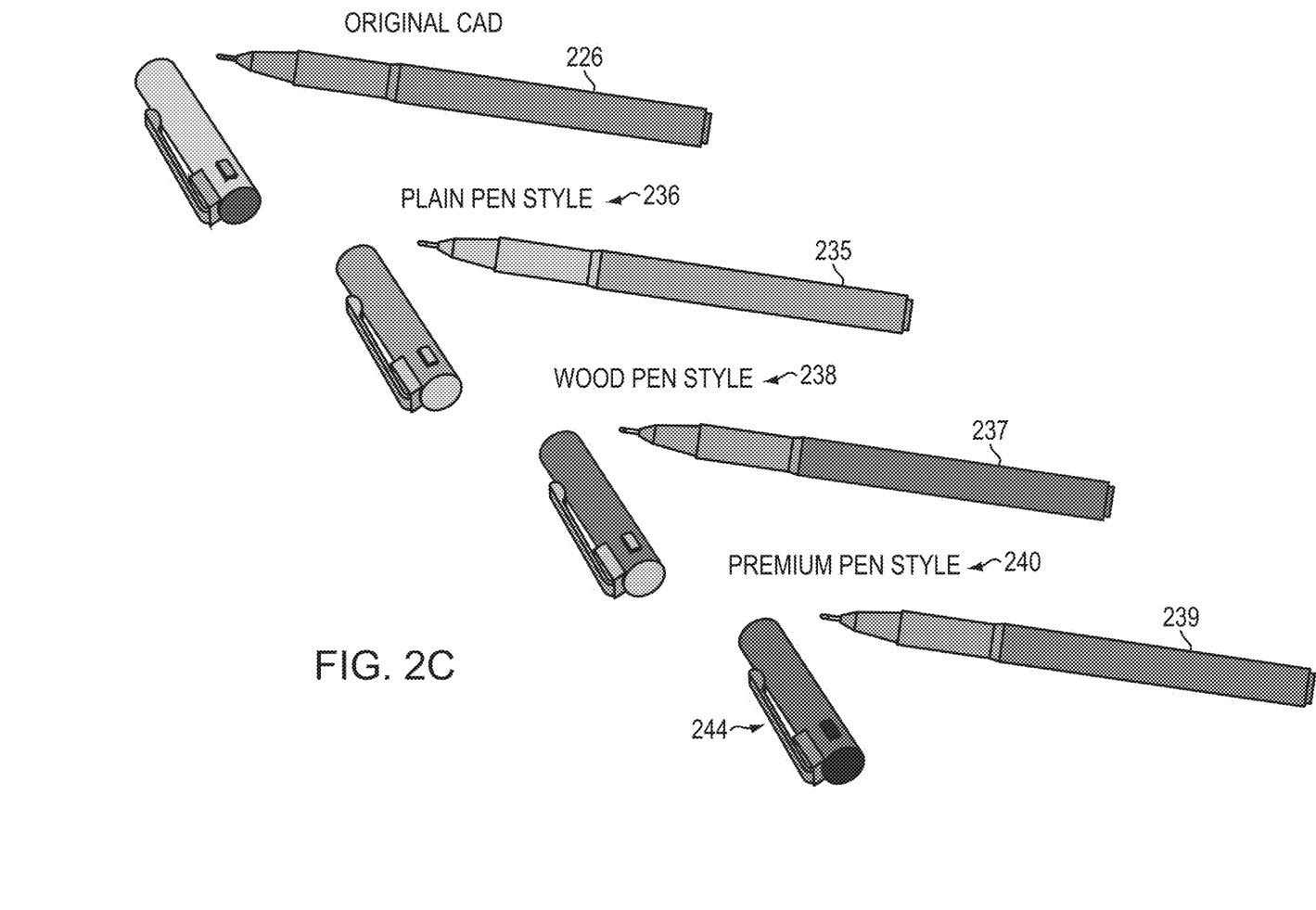
Figure 2D:
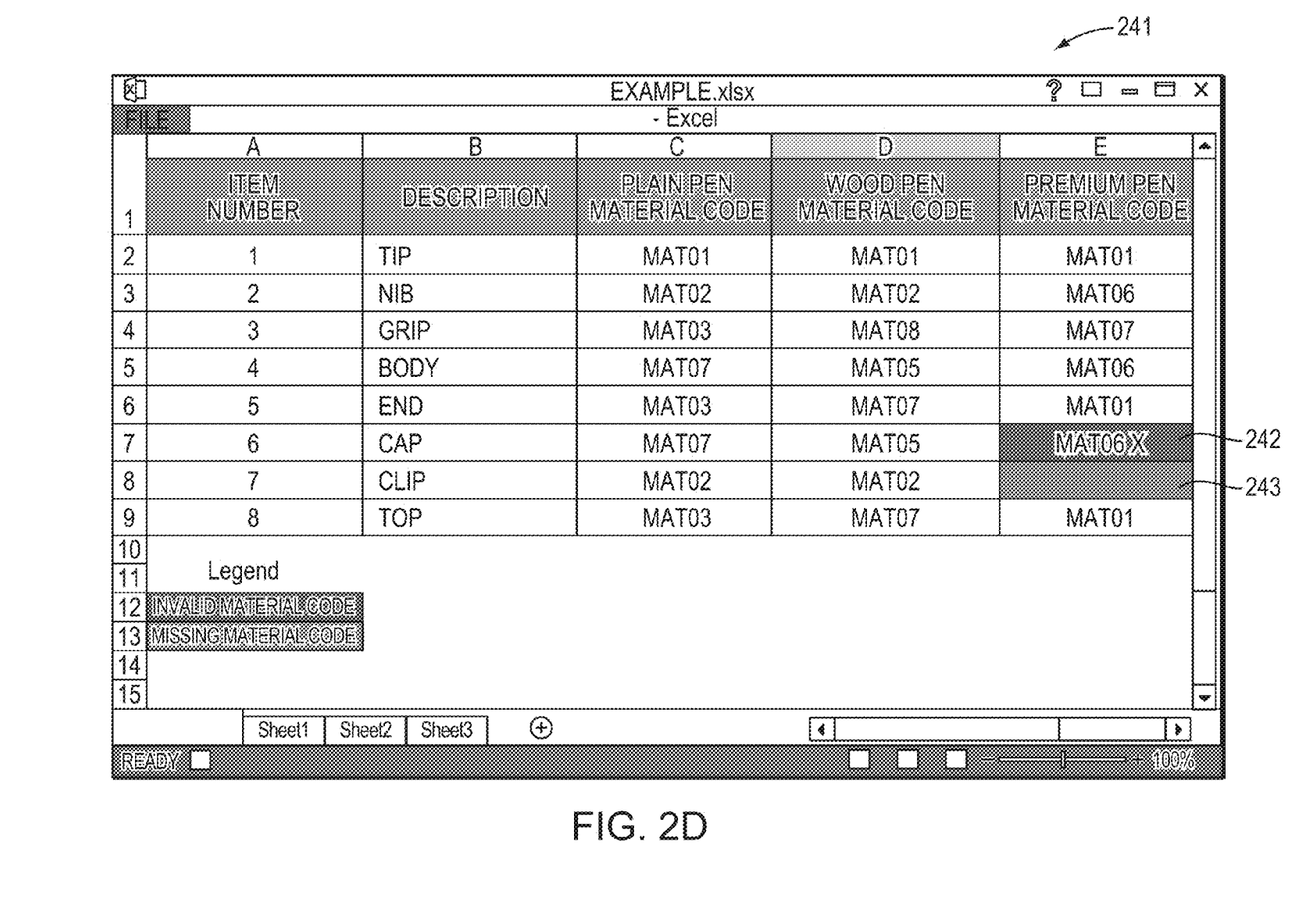

Next, the CAD model, such as the various versions of the CAD model 226, 235, 237, and 239 are displayed. As described herein, such an embodiment uses the structured database 227 as well indications associating parts of the CAD model 226 with item numbers (which may be determined using the style sheets 222a-b) to render the CAD models 235, 237, and 239, with the material information corresponding to the plain pen style 236, wood pen style 238, and premium pen style 240, respectively.

The process of FIGS. 2A-D continues with error checking of the unstructured data 220 as described herein. In this example, the error checking identifies the material code error 242 and the omission 243 and provides (outputs) a modified version of the unstructured data 241 to a user to facilitate correction of the errors. Further, according to an embodiment, the error checking may highlight a part of the CAD model associated with the identified error. For instance, in FIG. 2C the pen clip 244 that is associated with the omission 243 is highlighted in the display of the CAD model 239 of the premium pen style 240.

Figure 3:
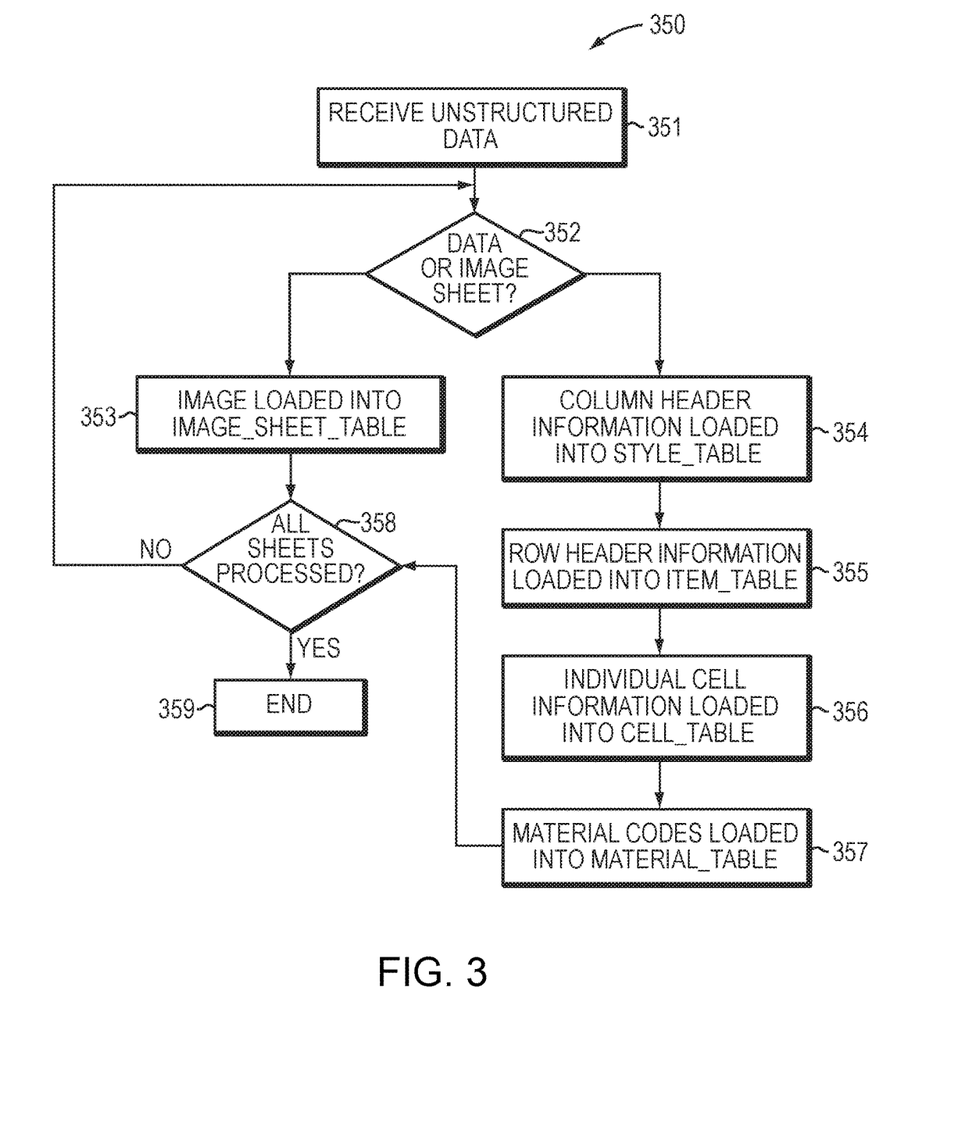
FIG. 3 is a flowchart of a method of processing data in a step of FIG. 1 that may be employed in embodiments of the present invention.

FIG. 3 is a flowchart of a process 350 for reformatting unstructured data, e.g., the spreadsheet data 220 into a structured database, e.g., the structured database 227. The method 350 may be used in any embodiment of the invention described herein so as to reformat the unstructured data into a structured database. For instance, the method 350 may be used at step 103 of the method 100. Further, the reformatting method 350 may be modified for any conditional programming that is desired and needed in light of the received unstructured data (e.g. 220) and thus, the reformatting method 350 may be customized for the content of the unstructured data that is being reformatted.

The method 350 begins at step 351 by receiving unstructured (spreadsheet) data 220. Next, it is determined at step 352 whether where a given worksheet of the spreadsheet data is a data sheet or an image sheet. If the given worksheet is an image sheet, the image from the image sheet is loaded into the image sheet table at step 353. If the given worksheet is a data sheet, column header information is loaded into the style table at step 354. The processing of the data sheet continues by loading row header information into the item table at step 355 and loading individual cell information into the cell table at step 356. Then, the material codes from the given worksheet are loaded into the material table at step 357. At this point, the given worksheet has been processed and reformatted into a structured database and tables thereof. The method 350 determines at step 358 if all sheets of the spreadsheet data have been processed. If all of the sheets have not been processed, the method 350 returns to step 352 and processes a next worksheet and, if all of the worksheet have been processed, the method 350 ends 359.

Another example method of displaying a CAD model, according to an embodiment of the present invention begins by creating a CAD model and continues by creating a material library of finish materials. Such functionality may create the material library by automatically connecting with third party providers such as Thierry Corporation (of Detroit, Mich.), via a website or other such interface, and from material samples in a material database. Next, the method ingests spreadsheet data, such as color and style data, that relates material information and item numbers and includes image sheets, into a database for a given CAD model. In the example of a vehicle, this may include ingesting the material/item number information for a given car model for all of the car model's trim options. In turn, the method receives indications identifying item numbers associated with given CAD geometries, i.e., parts and model elements of the CAD model. These indications may be the result of a user using image sheets to identify the item numbers associated with the given CAD geometries and tagging the CAD geometries with the associated item numbers. This tagging may accomplished through any means that associates item numbers with parts of the CAD model. For instance, in an example embodiment, this tagging may be the result of updating data, e.g., metadata, associated with the individual parts of the CAD model to include each part's respective item number. To display the CAD model, a trim/style package is selected, and in response, an embodiment system/methods generates and displays (or otherwise renders, outputs) the CAD model through use of the database and indications identifying item numbers associated with given CAD geometries.

Such an embodiment may further include error checking functionalities. In one such example embodiment, a non-valid material list which indicates the associated items/geometries is provided. Such a list, for example, may indicate that there is no identified color for a part of the CAD model, e.g., steering wheel. Another example embodiment prepares a non-digitized material list and identifies the associated CAD geometries that are lacking finish material information. This prepared list may include a list of materials that are referenced on geometries across possible styles whereby a digital representation of those materials has not yet been created in a materials database, i.e., the materials are non-digitized. In an embodiment, this list can be alphanumerical and have duplicates removed. Further, the CAD geometries which reference these non-digitized materials may be uniquely colored to visually indicate the missing data. Embodiments may also facilitate selection of non-digitized materials in order to isolate relevant CAD geometries. Further still, an embodiment of the present invention compares different versions of the unstructured data, e.g. color and style data, identifies changes between the versions and updates the CAD model tagging. Moreover, yet another embodiment modifies the unstructured data, e.g., spreadsheet data, or generates new spreadsheet data, which indicates cells where information is missing or incorrect. This newly modified/generated spreadsheet data may then be exported and provided to a user or another computing system for reprocessing and ultimately updating the corresponding structured database.

To provide such functionality, embodiments process finish material from non-CAD/non-PLM sources into a relational database and further, clean (normalize) that ingested data so the data conforms to common format standards so as to ensure data integrity. Further, when necessary, embodiments can prompt a user to correct automatically identified errors in the data.

By leveraging the mapping achieved by embodiments of the invention, alternative embodiments can provide further features for facilitating display of CAD models. In one such example embodiment, a user interface is provided inside an existing software suite, such as DeltaGen by Dassault Systemes, that provides users with the ability to search and reference the source database, e.g. the structured database information. Such an interface may also provide filters and other data sorting functionality as a well a way for a user to connect the source data to the 3D model data, i.e., converted CAD data. Yet another embodiment provides a user interface, for instance, in an existing software suite that allows for easy switching between different logic conditions. Further, in such an embodiment, a visual depiction of the CAD model with the different finish materials may be displayed based on the modified logic conditions as well as the logic conditions in the source data. Embodiments also provide functionality to correct errors in the CAD model rendering through use of the structured database and achieved mapping of finish material to parts of the CAD model. In one such example embodiment, visual cues, e.g., highlighting, is used to indicate finish materials that do not have a matching digital shader in a digital shader library used for rendering the CAD model. Yet another embodiment compares updated source data, e.g., spreadsheet data, against prior database data and determines what has changed and how to best manage those changes.

Moreover, embodiments can provide an image-based comparison tool for comparing visual differences between image-based source data. In yet another embodiment, a digital shader library for finish materials is provided and referenced by the structured database. Yet another example embodiment provides database reporting tools to aid a user in information gathering, including saved queries.

Embodiments of the present invention provide an automated way to display a CAD model with appropriate finish materials. Thus, embodiments are more efficient (time and computationally), accurate (less likelihood of human error), and repeatable (less likely for human error in the source data to go undetected). Embodiments of the present invention can thus, greatly reduce time in displaying a CAD model with finish material and greatly improve computational efficiency. For example, initial tests of an example embodiment have shown, in the example of automotive products, that the process of displaying a CAD model with material finishes can be shortened from three weeks to approximately one day through use of the principles of the present invention.

In embodiments, this efficiency is achieved through a significant use of automation such as the harvesting of unstructured data sources and implementation of data integrity with constraints via the relational (structured) database. Embodiments transform a two-dimensional (2D) problem (spreadsheet text rows/columns with 2D drawings and callouts) into an interactive 3D problem-solution. By transforming textual issues mapped as colors onto 3D geometry, embodiments enable users to visually and spatially focus on problematic areas within the data. This includes errors, omissions, and changes.

As described herein the embodiments of the present invention provide various methods and systems for displaying CAD models. In one such example embodiment, the method is provided as a software plug-in module that may be incorporated into existing CAD and PLM software suites, e.g. DeltaGen.

Figure 4:
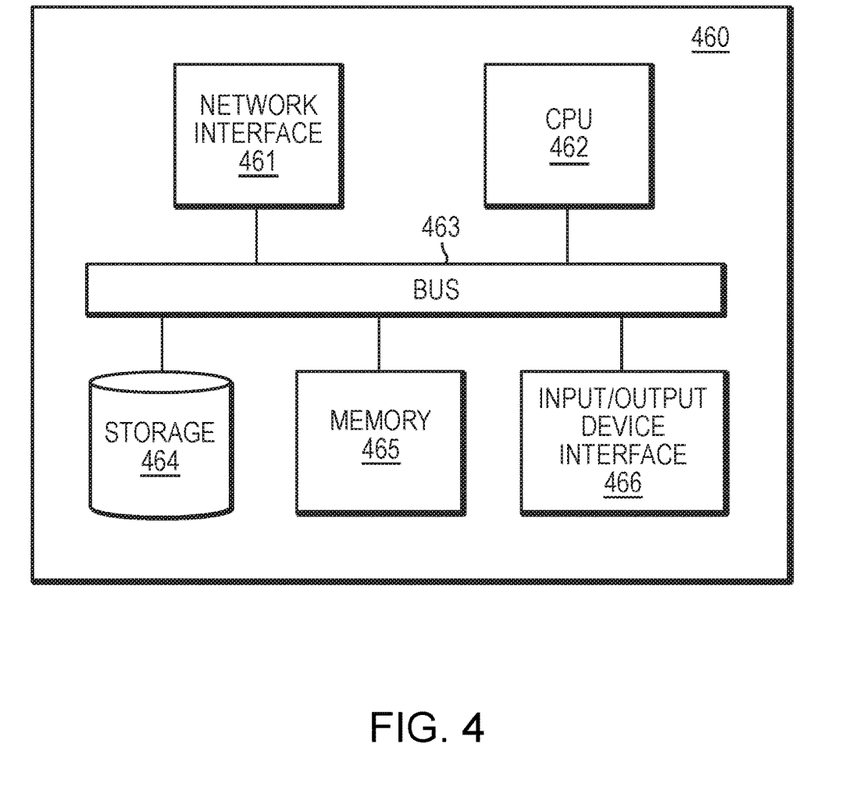
FIG. 4 is a simplified block diagram of a system for displaying a CAD model according to an embodiment.

FIG. 4 is a simplified block diagram of a computer-based system 460 that may be used to display a CAD model according to an embodiment of the present invention. The system 460 comprises a bus 463. The bus 463 serves as an interconnect between the various components of the system 460. Connected to the bus 463 is an input/output device interface 466 for connecting various input and output devices such as a keyboard, mouse, display, speakers, etc. to the system 460. A central processing unit (CPU) 462 is connected to the bus 463 and provides for the execution of computer instructions. Memory 465 provides volatile storage for data used for carrying out computer instructions.

Storage 464 provides non-volatile storage for software instructions, such as an operating system (not shown). The system 460 also comprises a network interface 461 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 460, or a computer network environment such as the computer environment 570, described herein below in relation to FIG. 5. The computer system 460 may be transformed into the machines that execute the methods (e.g., 100, 350) described herein, for example, by loading software instructions into either memory 465 or non-volatile storage 464 for execution by the CPU 462. One of ordinary skill in the art should further understand that the system 460 and its various components may be configured to carry out any embodiments of the present invention described herein. Further, the system 460 may implement the various embodiments described herein utilizing any combination of hardware, software, and firmware modules operatively coupled, internally, or externally, to the system 460.

Figure 5:
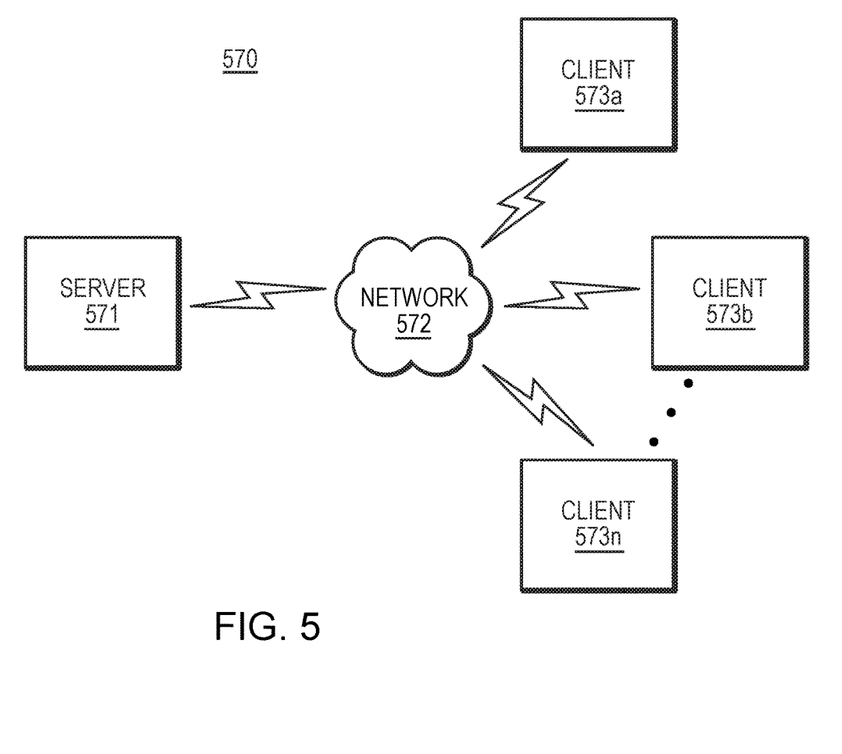
FIG. 5 is a simplified diagram of a computer network environment in which an embodiment of the present invention may be implemented.

FIG. 5 illustrates a computer network environment 570 in which an embodiment of the present invention may be implemented. In the computer network environment 570, the server 571 is linked through the communications network 572 to the clients 573a-n. The environment 570 may be used to allow the clients 573a-n, alone or in combination with the server 571, to execute any of the methods (e.g., 100, 350) described herein. For non-limiting example, computer network environment 570 provides cloud computing embodiments, software as a service (SAAS) embodiments, and the like.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims. For example, display, render, output are used interchangeably in this disclosure of the invention.

What is claimed is:

1. A computer-implemented method of displaying a computer-aided design (CAD) model with material finishes in a CAD system, the method comprising:
    defining, in memory of the CAD system, a three-dimensional (3D) CAD model representing a real-world physical object, the CAD model comprising a plurality of parts;
    via one or more processors:
    obtaining unstructured spreadsheet data in a plurality of data types storing information in cells, wherein at least one of the plurality of data types is an image data type and the unstructured spreadsheet data relates material finishes with item numbers;
    reformatting the obtained unstructured spreadsheet data into a structured relational database by executing conditional programming that is a function of the plurality of data types of the unstructured spreadsheet data, the conditional programming dictating where to store the information from the cells of the unstructured spreadsheet data in pre-specified tables of the structured relational database based on the plurality of data types;
    receiving indications, separate from the unstructured spreadsheet data, associating the parts of the CAD model with the item numbers; and
    automatically displaying, in the CAD system, the CAD model with the parts having the material finishes based on the structured relational database and the received indications of item numbers associated with the parts of the CAD model.

2. The method of claim 1 wherein automatically displaying the CAD model comprises:
    identifying a given item number associated with a given part of the CAD model;
    in the structured relational database, determining a respective material finish related to the given item number; and
    displaying the given part of the CAD model with the determined material finish.

3. The method of claim 1 further comprising:
    automatically integrating material information from a third party source into the structured relational database.

4. The method of claim 1 wherein the obtained unstructured spreadsheet data relates material finish to item numbers based upon a style package associated with the item numbers.

5. The method of claim 1 wherein the unstructured spreadsheet data contains conditional logic that relates the material finishes with the item numbers.

6. The method of claim 1 further comprising:
    identifying an error in the structured relational database relating material finishes with item numbers.

7. The method of claim 6 wherein displaying the CAD model further comprises:
    highlighting, in the displayed CAD model, a given part associated with the identified error.

8. The method of claim 6 further comprising:
    prompting the user to correct the identified error.

9. A computer-aided design (CAD) system for displaying a model with material finishes in the CAD system, the CAD system comprising:
  a processor; and
  a memory with computer code instructions stored thereon, the processor and the memory, with the computer code instructions, being configured to cause the system to:
    define, in the memory of the CAD system, a three-dimensional (3D) CAD model representing a real-world physical object, the CAD model comprising a plurality of parts;
    obtain unstructured spreadsheet data in a plurality of data types storing information in cells, wherein at least one of the plurality of data types is an image data type and the unstructured spreadsheet data relates material finishes with item numbers;
    reformat the obtained unstructured spreadsheet data into a structured relational database by executing conditional programming that is a function of the plurality of data types of the unstructured spreadsheet data, the conditional programming dictating where to store the information from the cells of the unstructured spreadsheet data in pre-specified tables of the structured relational database based on the plurality of data types;
    receive indications, separate from the unstructured spreadsheet data, associating the parts of the CAD model with the item numbers; and
    automatically display, in the CAD system, the CAD model with the parts having the material finishes based on the structured relational database and the received indications of item numbers associated with the parts of the CAD model.

10. The CAD system of claim 9 where, in automatically displaying the CAD model, the processor and the memory, with the computer code instructions, are further configured to cause the CAD system to:
  identify a given item number associated with a given part of the CAD model;
  in the structured relational database, determine a respective material finish related to the given item number; and
  display the given part of the CAD model with the determined material finish.

11. The CAD system of claim 9 where the processor and the memory, with the computer code instructions, are further configured to cause the CAD system to:
  automatically integrate material information from a third party source into the structured relational database.

12. The CAD system of claim 9 wherein the obtained unstructured spreadsheet data relates material finish to item numbers based upon a style package associated with the item numbers.

13. The CAD system of claim 9 wherein the unstructured spreadsheet data contains conditional logic that relates the material finishes with the item numbers.

14. The CAD system of claim 9 where the processor and the memory, with the computer code instructions, are further configured to cause the CAD system to:
  identify an error in the structured relational database relating material finishes with item numbers.

15. The CAD system of claim 14 where, in displaying the CAD model, the processor and the memory, with the computer code instructions, are further configured to cause the CAD system to:
  highlight, in the displayed CAD model, a part associated with the identified error.

16. The CAD system of claim 14 where the processor and the memory, with the computer code instructions, are further configured to cause the CAD system to:
  prompt the user to correct the identified error.

17. A non-transitory computer program product for displaying a computer aided design (CAD) model with material finishes in a CAD system, the computer program product executed by a server in communication across a network with one or more clients and comprising:
  a non-transitory computer readable medium, the computer readable medium comprising program instructions which, when executed by a processor, causes the processor to:
    define, in memory of the CAD system, a three-dimensional (3D) CAD model representing a real-world physical object, the CAD model comprising a plurality of parts;
    obtain unstructured spreadsheet data in a plurality of data types storing information in cells, wherein at least one of the plurality of data types is an image data type and the unstructured spreadsheet data relates material finishes with item numbers;
    reformat the obtained unstructured spreadsheet data into a structured relational database by executing conditional programming that is a function of the plurality of data types of the unstructured spreadsheet data, the conditional programming dictating where to store the information from the cells of the unstructured spreadsheet data in pre-specified tables of the structured relational database based on the plurality of data types;
    receive indications, separate from the unstructured spreadsheet data, associating the parts of the CAD model with the item numbers; and
    automatically display, in the CAD system, the CAD model with the parts having the material finishes based on the structured relational database and the received indications of item numbers associated with the parts of the CAD model.

18. The computer program product of claim 17 where, in automatically displaying the CAD model, the program instructions, when executed, cause the processor to:
  identify a given item number associated with a given part of the CAD model;
  in the structured relational database, determine a respective material finish related to the given item number; and
  display the given part of the CAD model with the determined material finish.

19. The computer program product of claim 17 wherein the obtained unstructured spreadsheet data relates material finish to item numbers based upon a style package associated with the item numbers.

20. The computer program product of claim 17 wherein the unstructured spreadsheet data contains conditional logic that relates the material finishes with the item numbers.

* * * * *